June 12, 1973 A. LAKER 3,738,880

METHOD OF MAKING A SEMICONDUCTOR DEVICE

Filed June 23, 1971

INVENTOR.
Abraham Laker
BY
Glenn H. Bruestle
ATTORNEY 3,738,880
METHOD OF MAKING A SEMICONDUCTOR DEVICE Abraham Laker, Lebanon, N.J., assignor to RCA Corporation Filed June 23, 1971, Ser. No. 155,899
Int. Cl. H01l 7/50, 7/44
U.S. Cl. 156—17 3 Claims

ABSTRACT OF THE DISCLOSURE

Portions of a polycrystalline silicon layer disposed on a silicon dioxide insulating layer on a semiconductor wafer are removed after diffusing boron into and through the regions to be retained. Good edge definition of the retained silicon and improved yields resulting from fewer oxide pinholes are achieved.

BACKGROUND OF THE INVENTION

This invention relates to semiconductor devices and pertains more particularly to a method of making a patterned polycrystalline silicon layer in such devices.

Deposited layers of polycrystalline silicon have been used in integrated circuit devices as the material of conductors and resistors. MOS semiconductor devices of the so-called self-aligned silicon gate type exemplify the use of polycrystalline silicon as a conductor. In many known devices, including the silicon gate devices, deposited polycrystalline silicon conductors overlie an insulating coating, usually of silicon dioxide, on a device wafer. Heretofore, the silicon has been deposited as an intrinsic film; the portions of the film intended to remain have been masked off with an etch resistant mask; and the unmasked portions of the film have been etched away. Subsequently, the remaining portions of the film are doped to render them conductive. The doping process when done conventionally produces a silicate glass film on the silicon and on the exposed silicon dioxide insulator. This film is usually removed by etching in a suitable solvent, and most common solvents will also attack the underlying silicon dioxide layer, a similarly constituted material. Yield losses occur when the solvent attacks weak spots in the silicon dioxide layer, producing pinholes.

THE DRAWINGS

FIGS. 1 to 4 are partial cross sections of a semiconductor wafer illustrating the steps of the present novel process.

DETAILED DESCRIPTION

The structure produced

Figure 4:
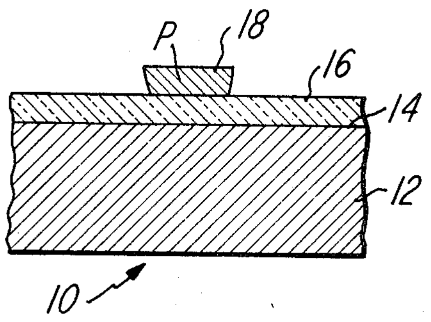

FIG. 4 illustrates a portion of a semiconductor wafer 10 made by the present novel process. The wafer 10 includes a body 12 of semiconductive material such as silicon which has a surface 14 adjacent to which the devices of the integrated circuit (not shown) are formed, in known fashion. An insulator 16 consisting of, for example, thermally grown silicon dioxide is disposed on the surface 14. A conductor 18 of polycrystalline silicon of P type conductivity in this example, is disposed on the insulator 16. The conductor 18 may be a gate electrode for an MOS device or it may be an interconnection conductor or the like.

Fabrication process

Figure 1:
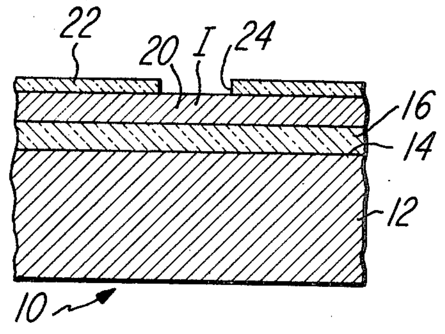
Figure 2:
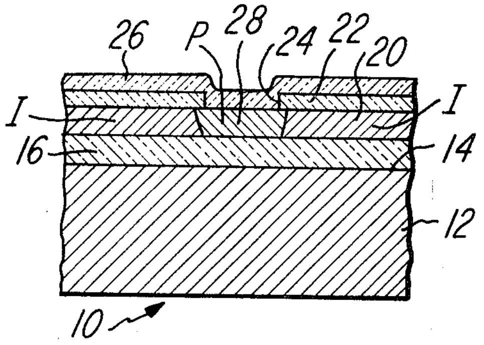
Figure 3:
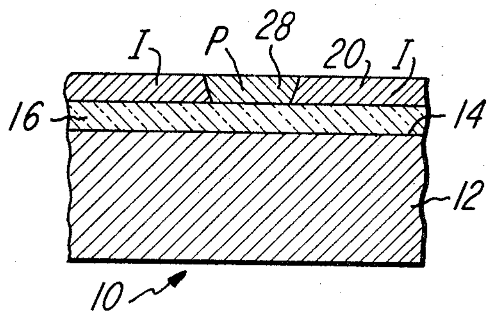

FIG. 1 illustrates the cross sectional configuration of the wafer 10 at an early stage in the present novel process. The first step in this process is to deposit a continuous film 20 of substantially intrinsic polycrystalline silicon on the insulator 16. This may be accomplished by the thermal decomposition of silane ($SiH_4$) diluted with hydrogen in the manner known in the preparation of the silicon gate MOS devices. The thickness of the layer 20 may be approximately 8000 A.

The next step is to deposit a layer 22 of silicon dioxide, for example, to form a diffusion masking coating over the polycrystalline silicon layer 20. This may be done by the thermal decomposition of silane or siloxane, also in known manner; or, the surface of the layer 20 may be oxidized. An opening 24 is then defined in the coating 22 by photolithographic techniques at the location desired for the conductor 18.

The wafer 10 is next heated in the presence of a source of a P type impurity such as boron in an oxidizing atmosphere to form a borosilicate glass coating 26 (FIG. 2) on the surface of the masking coating 22 and on the exposed surface of the polycrystalline silicon layer 20. Thereafter, the wafer 10 is heated to diffuse boron entirely through the film 20 to the insulator 16 to produce a doped region 28 as shown. The doped region 28 becomes the conductor 18 in the following steps.

The boron glass coating 26 and the masking coating 22 are next removed by etching in a suitable solvent. The intrinsic portions only of the film 20 are next removed. I have discovered that no etch resistant mask is required over the P doped region 28 of the film 20. I have found that the known solvents for silicon are selective for substantially intrinsic silicon, that is, they are solvents in which intrinsic silicon is relatively soluble but in which P doped silicon is substantially insoluble. N doped silicon, however, is relatively soluble. Suitable solvents are aqueous hydrazine solutions, potassium hydroxide-propanol solutions, and the like. The entire silicon film 20 is exposed to one of these solvents. The material will etch only in its intrinsic areas, resulting in clean, well defined edges of the conductor 18. The terms "soluble" and "insoluble" as used herein are intended to mean relatively soluble and insoluble. As is known, doped polycrystalline silicon can be etched in the acidic solutions, for example. The rate of etching, however, is inversely proportional to the doping level and highly doped material is extremely difficult to etch. Consequently, in the performance of the present method, the region 28 should be relatively highly doped.

In one example of the present method, the solvent may be an aqeuous solution of 64% hydrazine, by volume; the doping level of the conductor 18, that is, of the region 28, should then amount to a surface concentration of at least about $10^{16}$ atoms/cm.$^3$. As is known, the concentration of modifiers in a diffused region falls off exponentially from a maximum concentration at the surface through which the diffusion is carried out and it is common to describe doping concentrations in terms of the surface concentration as is done here. Under these conditions, good edge definition may be achieved.

The etching solutions described above for silicon do not attack silicon dioxide to an appreciable extent; therefore, the removal of the intrinsic areas of the film 20 is effectively self-limiting, that is, the etching will stop at the surface of the coating 16. Pinholes in the insulator 16 are not as likely to be formed in this process as in the prior art process described above. Consequently, substantial yield improvements may be expected.

What is claimed is:

1. A method of forming a patterned polycrystalline silicon layer on an insulator comprising the steps of depositing a continuous film of substantially intrinsic polycrystalline silicon on said insulator, doping those portions of said film intended to be retained as said layer with a P type impurity to a surface concentration of at least about $10^{16}$ atoms/cm.$^3$, and thereafter contacting the entire film with a solvent in which substantially intrinsic silicon is soluble but in which P doped silicon is substantially insoluble for a time sufficent to remove the substantially intrinsic silicon, said solvent being an aqueous hydrazine solution or a potassium hydroxide-propanol solution.

2. A method as defined in claim 1 wherein said doping step is carried out by diffusing conductivity modifiers into and through those portions of said film intended to be retained.

3. A method of making a layer of polycrystalline silicon on a portion of a surface of an insulator comprising the steps of depositing a continuous film of substantially intrinsic polycrystalline silicon on said insulator, forming a diffusion mask on said film leaving uncovered the portions thereof intended to become said layer, diffusing P type conductivity modifiers into and through the uncovered portions of said film to form a doped region extending entirely through said film, said doped region containing said P type conductivity modifiers in a surface concentration of at least $10^{16}$ atoms/cm.$^3$, said diffusing step being carried out in an oxidizing atmosphere whereby a silicate glass film is formed on the exposed surfaces of said diffusion mask and said polycrystalline silicon film, removing by etching said silicate glass film and said diffusion mask, and contacting the entire silicon film with a solvent in which intrinsic silicon is soluble but in which P doped silicon and the material of said insulator are substantially insoluble to remove only the undoped portions of said film, said solvent being an aqueous solution of hydrazine or a potassium hydroxide-propanol solution.

References Cited

UNITED STATES PATENTS 3,160,539 12/1964 Hall et al. ............ 156—17

J. STEINBERG, Primary Examiner

U.S. Cl. X.R.

148—187